US010304935B2

(12) United States Patent
Poelzl

(10) Patent No.: US 10,304,935 B2
(45) Date of Patent: May 28, 2019

(54) SEMICONDUCTOR DEVICE HAVING A TRENCH GATE ELECTRODE

(71) Applicant: Infineon Technologies Austria AG, Villach (AT)

(72) Inventor: Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 8 days.

(21) Appl. No.: 15/662,779

(22) Filed: Jul. 28, 2017

(65) Prior Publication Data

US 2017/0330946 A1 Nov. 16, 2017

Related U.S. Application Data

(62) Division of application No. 14/935,171, filed on Nov. 6, 2015, now Pat. No. 9,728,617.

(30) Foreign Application Priority Data

Nov. 14, 2014 (DE) ........................ 10 2014 116 706

(51) Int. Cl.
*H01L 29/423* (2006.01)
*H01L 29/40* (2006.01)
(Continued)

(52) U.S. Cl.
CPC .... *H01L 29/4236* (2013.01); *H01L 21/28114* (2013.01); *H01L 21/76897* (2013.01);
(Continued)

(58) Field of Classification Search
CPC .......... H01L 29/4236; H01L 29/66621; H01L 29/66734; H01L 29/7397; H01L 29/7827; H01L 21/823468; H01L 29/7813; H01L 21/28114; H01L 29/66719; H01L 21/76897; H01L 29/401; H01L 29/66348; H01L 21/0337; H01L 29/41766; H01L 29/6656; H01L 29/407; H01L 29/66727; H01L 29/41741; H01L 2924/0002
See application file for complete search history.

(56) References Cited

U.S. PATENT DOCUMENTS 7,633,109 B2   12/2009   Lee et al.
7,670,910 B2    3/2010   Kim et al.
(Continued)

FOREIGN PATENT DOCUMENTS

| CN | 101425466 A | 5/2009 |
| CN | 103426771 A | 12/2013 |
| DE | 102014108309 A1 | 12/2014 |

*Primary Examiner* — Su C Kim
(74) *Attorney, Agent, or Firm* — Murphy, Bilak & Homiller, PLLC

(57) ABSTRACT

A semiconductor device includes a semiconductor substrate comprising a main surface and a gate electrode in a trench between neighboring semiconductor mesas. The gate electrode is electrically insulated from the neighboring semiconductor mesas by a dielectric layer. The semiconductor device further includes a conductor arranged, at least partially, between neighboring dielectric contact spacers. The conductor has a conductivity greater than a conductivity of the gate electrode. An interface between the conductor and the gate electrode extends along the gate electrode.

22 Claims, 11 Drawing Sheets

(51) Int. Cl.
  *H01L 29/66* (2006.01)
  *H01L 21/28* (2006.01)
  *H01L 29/78* (2006.01)
  *H01L 21/8234* (2006.01)
  *H01L 21/768* (2006.01)
  *H01L 29/739* (2006.01)
  *H01L 29/417* (2006.01)
  *H01L 21/033* (2006.01)

(52) U.S. Cl.
  CPC .... *H01L 21/823468* (2013.01); *H01L 29/401* (2013.01); *H01L 29/66719* (2013.01); *H01L 29/66734* (2013.01); *H01L 29/7397* (2013.01); *H01L 29/7813* (2013.01); *H01L 29/7827* (2013.01); *H01L 21/0337* (2013.01); *H01L 29/407* (2013.01); *H01L 29/41741* (2013.01); *H01L 29/41766* (2013.01); *H01L 29/6656* (2013.01); *H01L 29/66348* (2013.01); *H01L 29/66727* (2013.01); *H01L 2924/0002* (2013.01)

(56) References Cited

U.S. PATENT DOCUMENTS

| | | |
|---|---|---|
| 8,012,828 B2 | 9/2011 | Min et al. |
| 8,859,367 B2 | 10/2014 | Mathew et al. |
| 9,029,220 B2 | 5/2015 | Poelzl |
| 9,355,957 B2 | 5/2016 | Poelzl |
| 2006/0113588 A1* | 6/2006 | Wu .................. H01L 29/66719 257/330 |
| 2007/0075362 A1 | 4/2007 | Wu |
| 2009/0008691 A1* | 1/2009 | Lee .................. H01L 27/10876 257/301 |
| 2012/0009772 A1 | 1/2012 | Mathew et al. |
| 2013/0043511 A1* | 2/2013 | Tsai ................ H01L 21/26506 257/288 |
| 2013/0302958 A1 | 11/2013 | Hossain et al. |
| 2014/0239388 A1* | 8/2014 | Lee .................... H01L 27/0629 257/334 |
| 2015/0221733 A1* | 8/2015 | Hsieh ............... H01L 29/66734 257/331 |
| 2015/0243773 A1* | 8/2015 | Basu .................... H01L 29/205 257/194 |

* cited by examiner

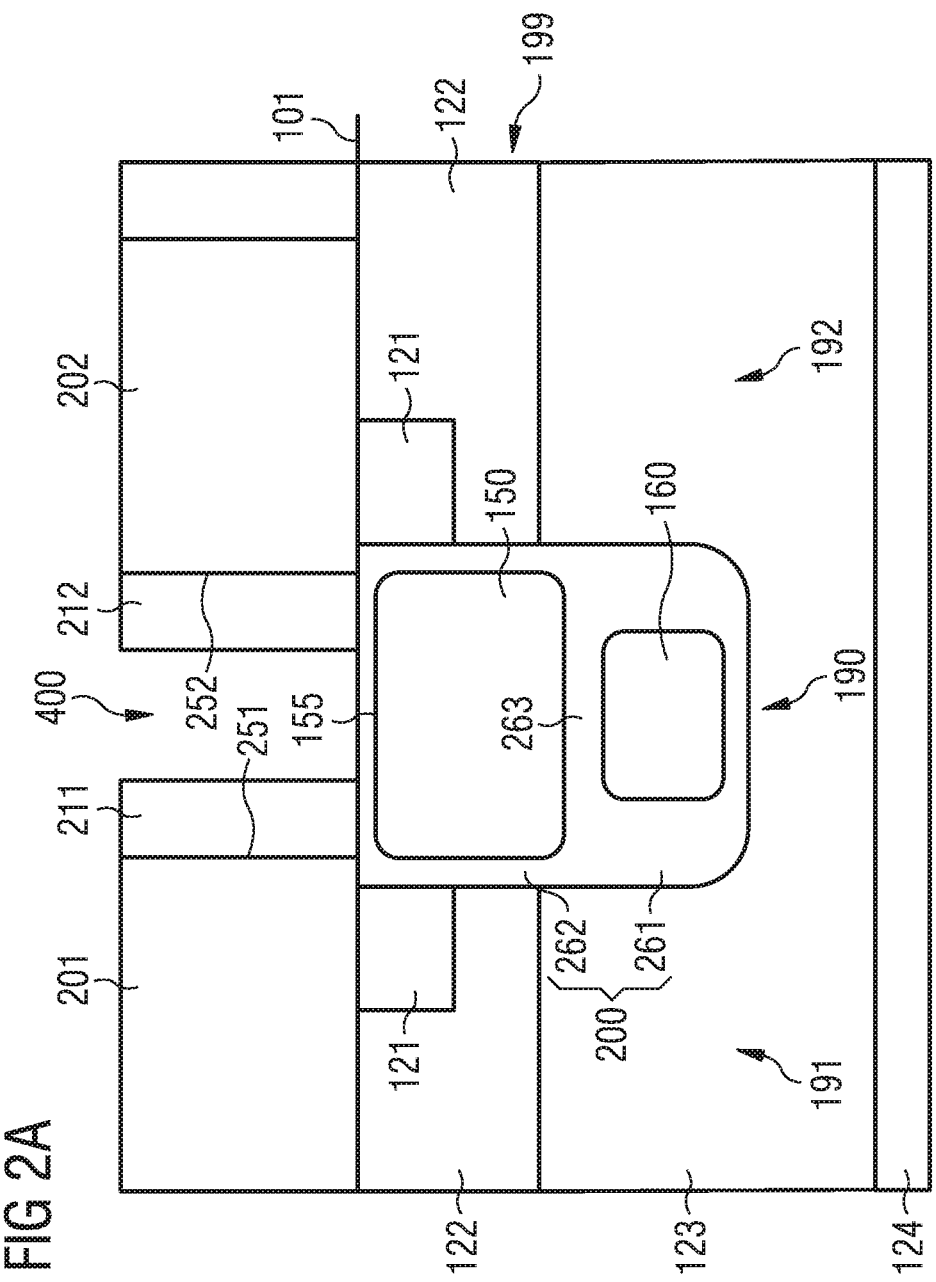

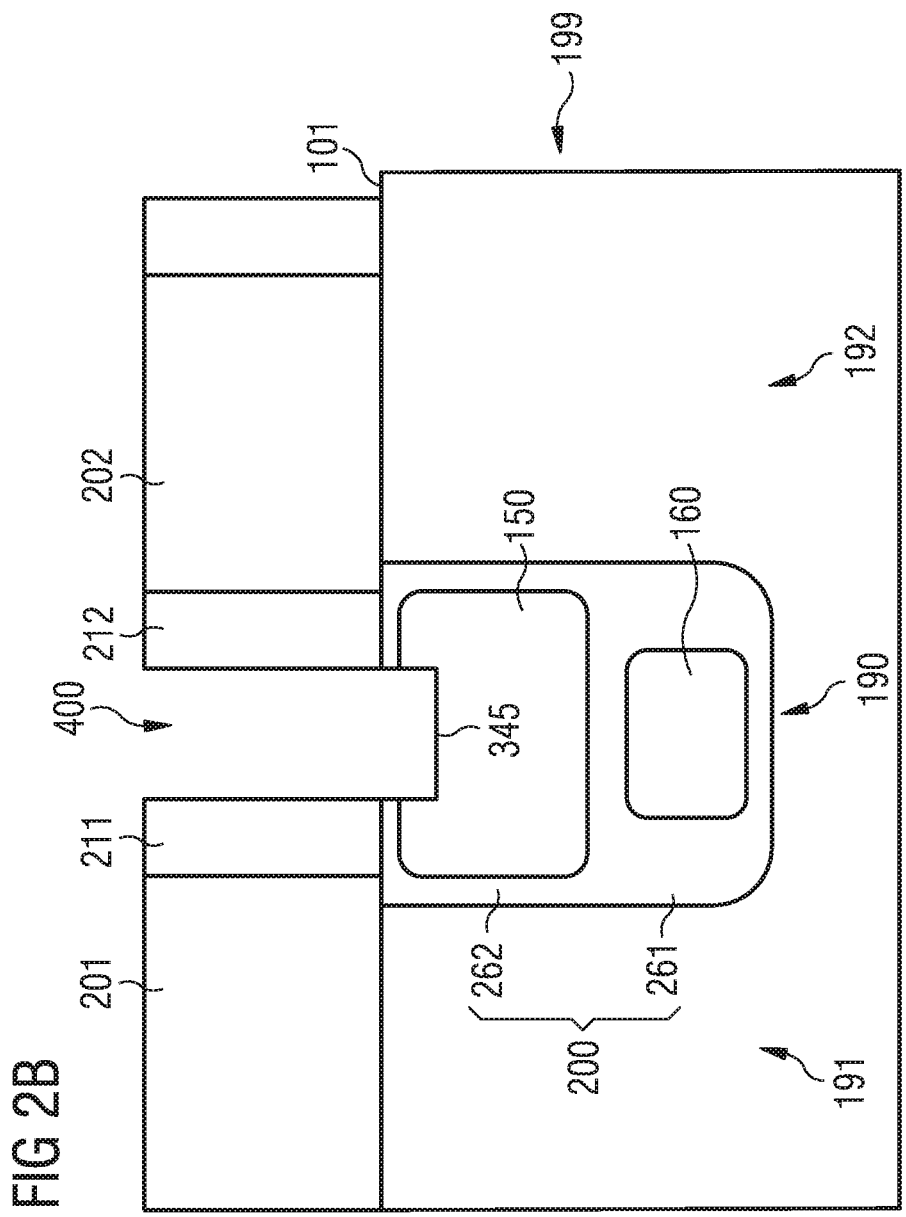

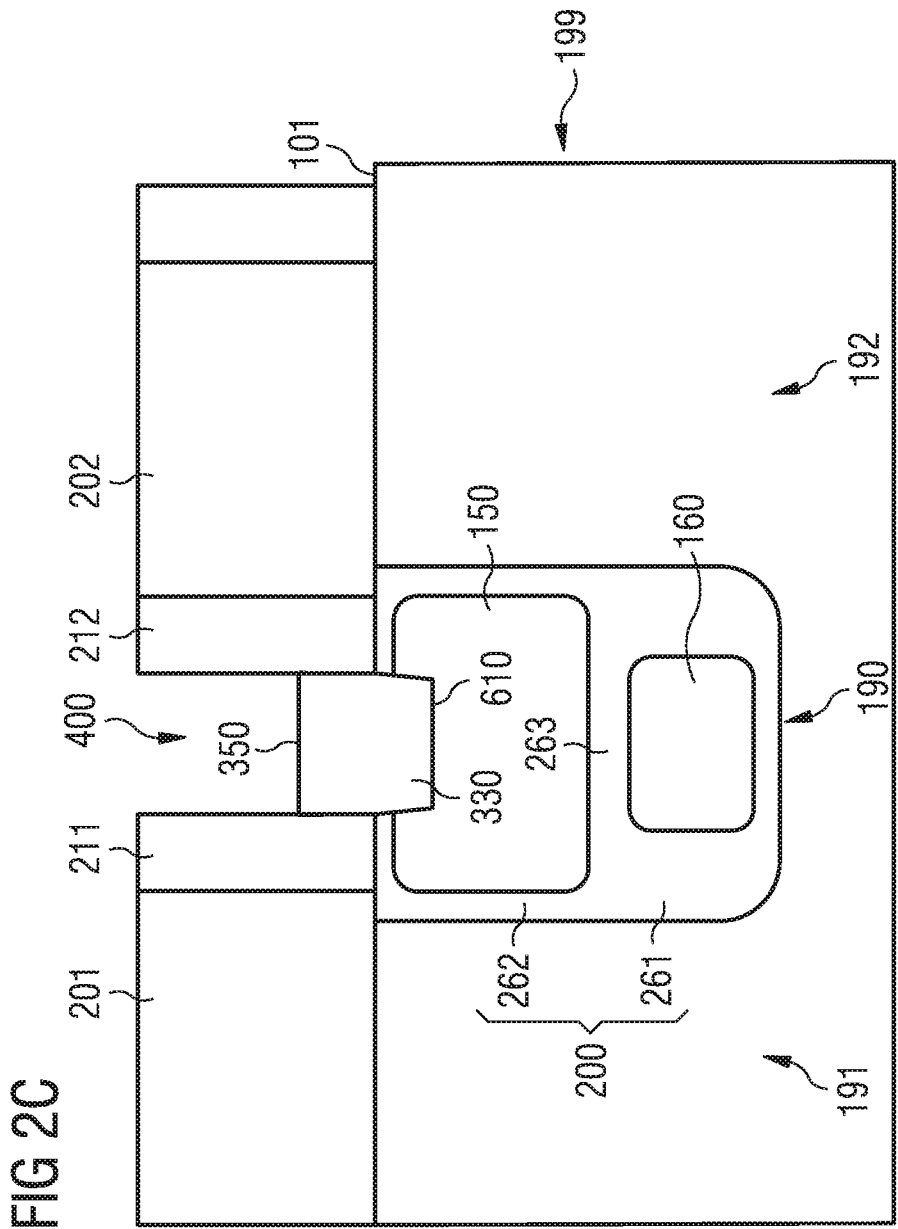

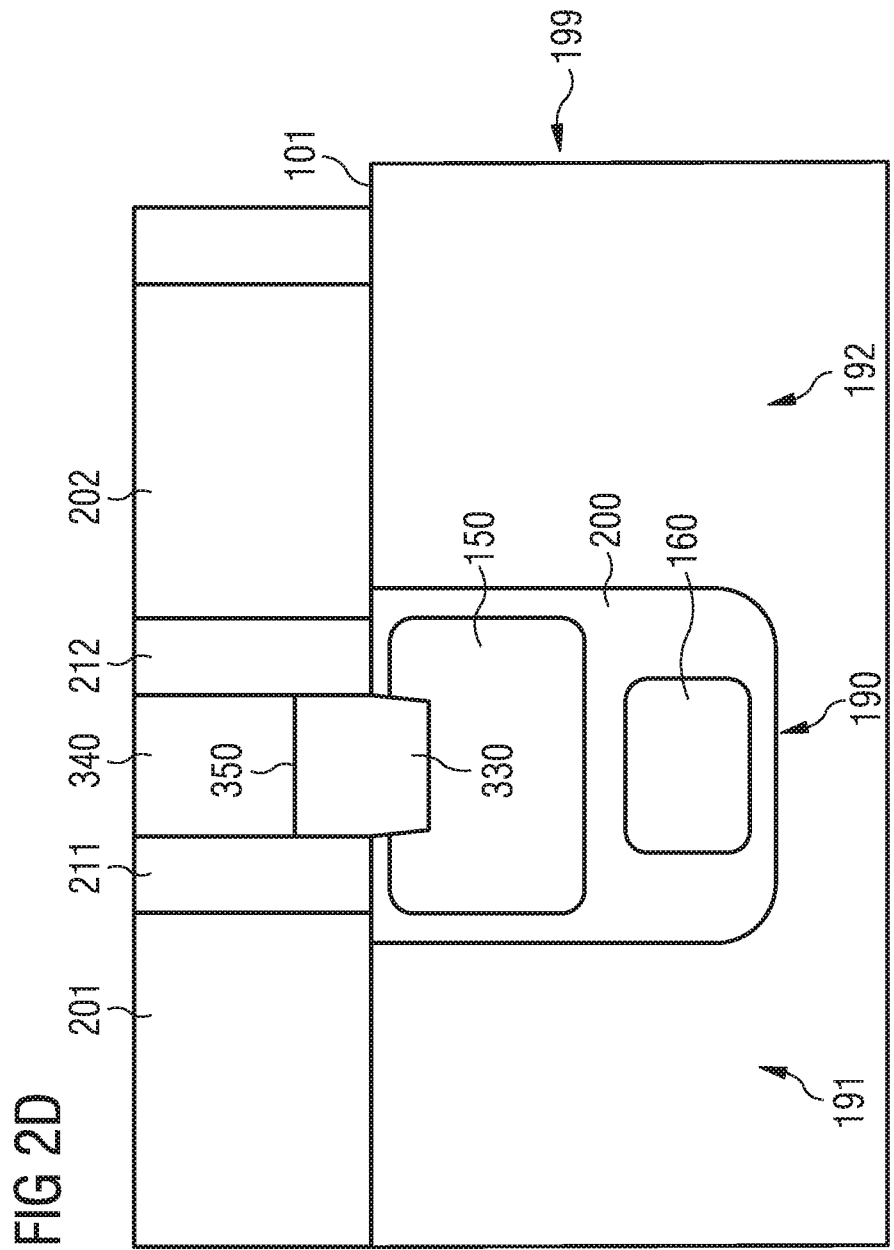

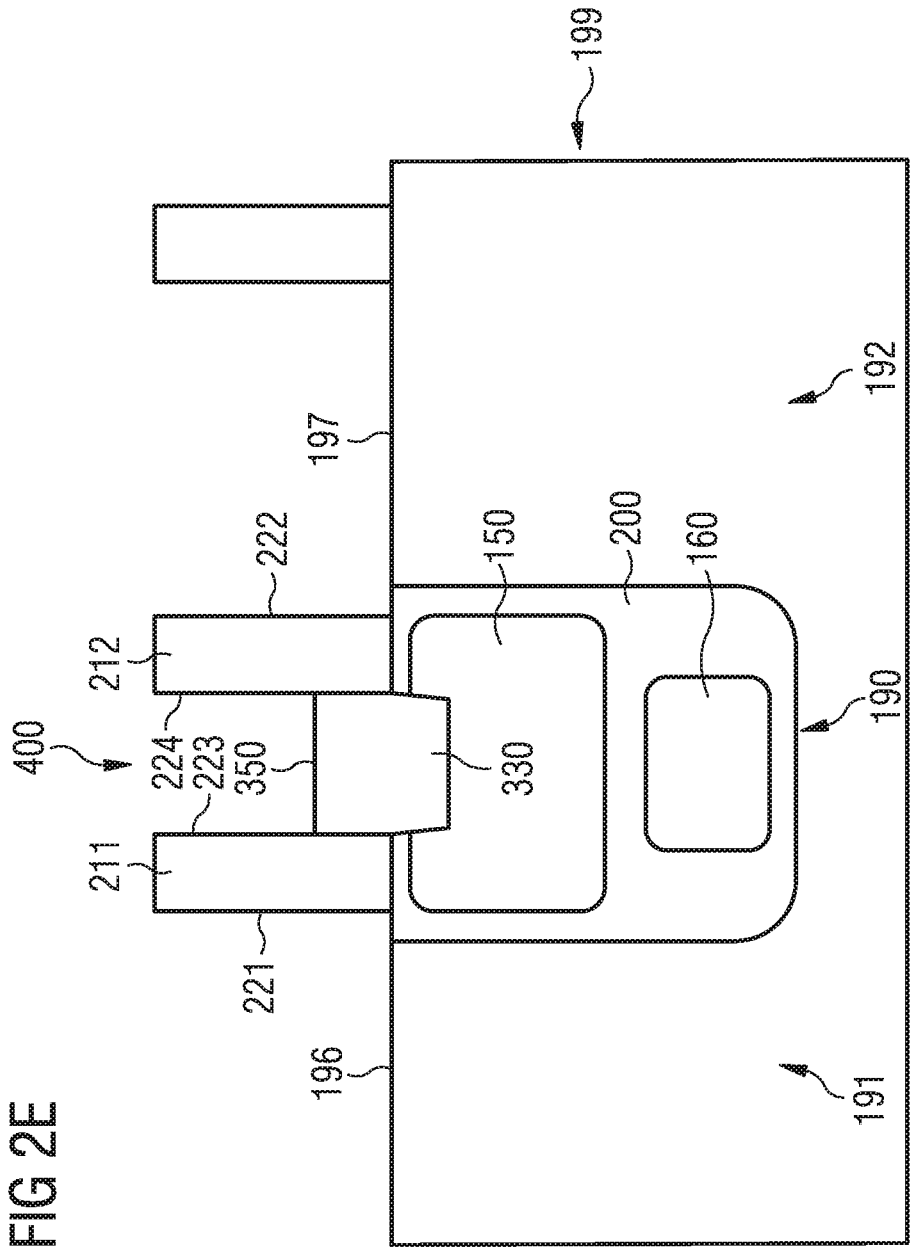

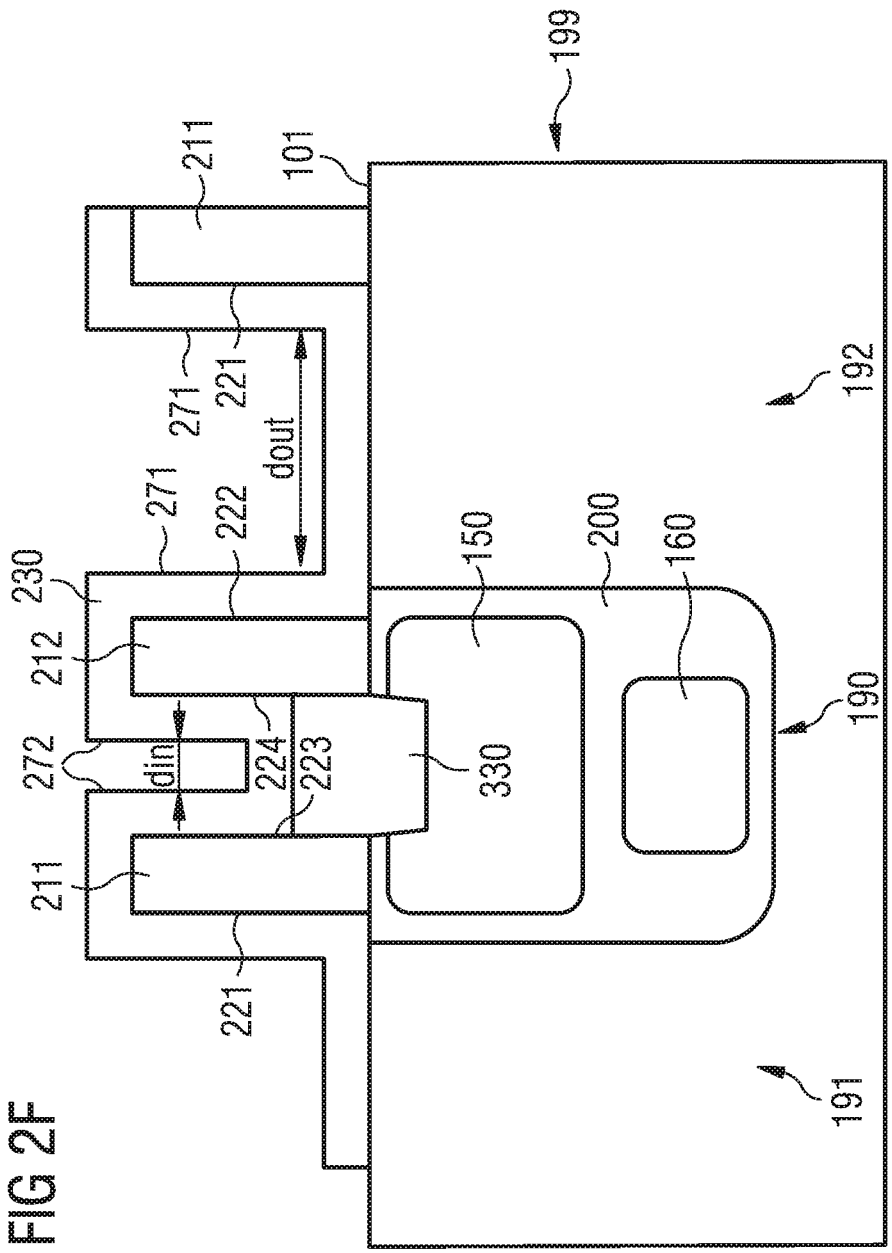

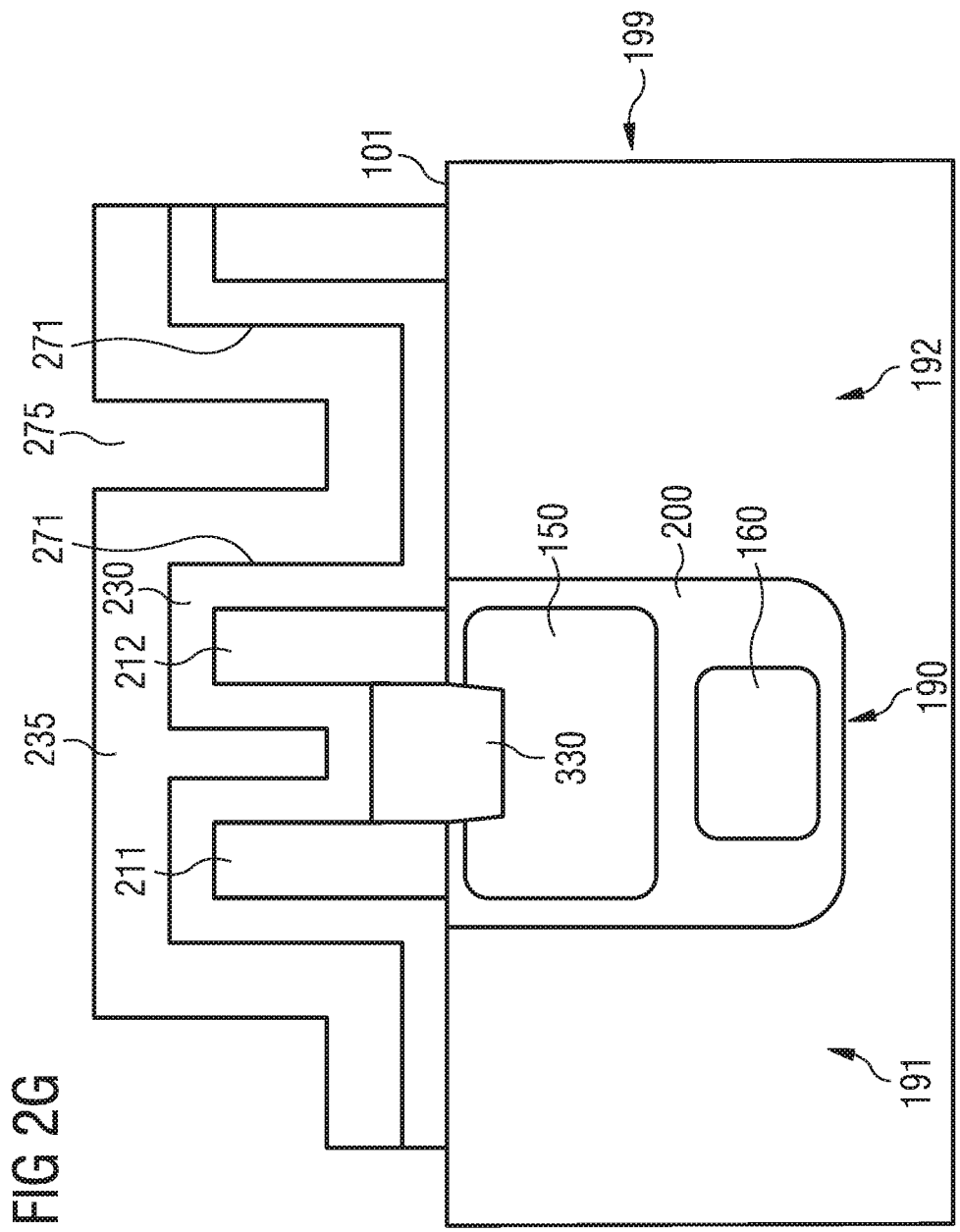

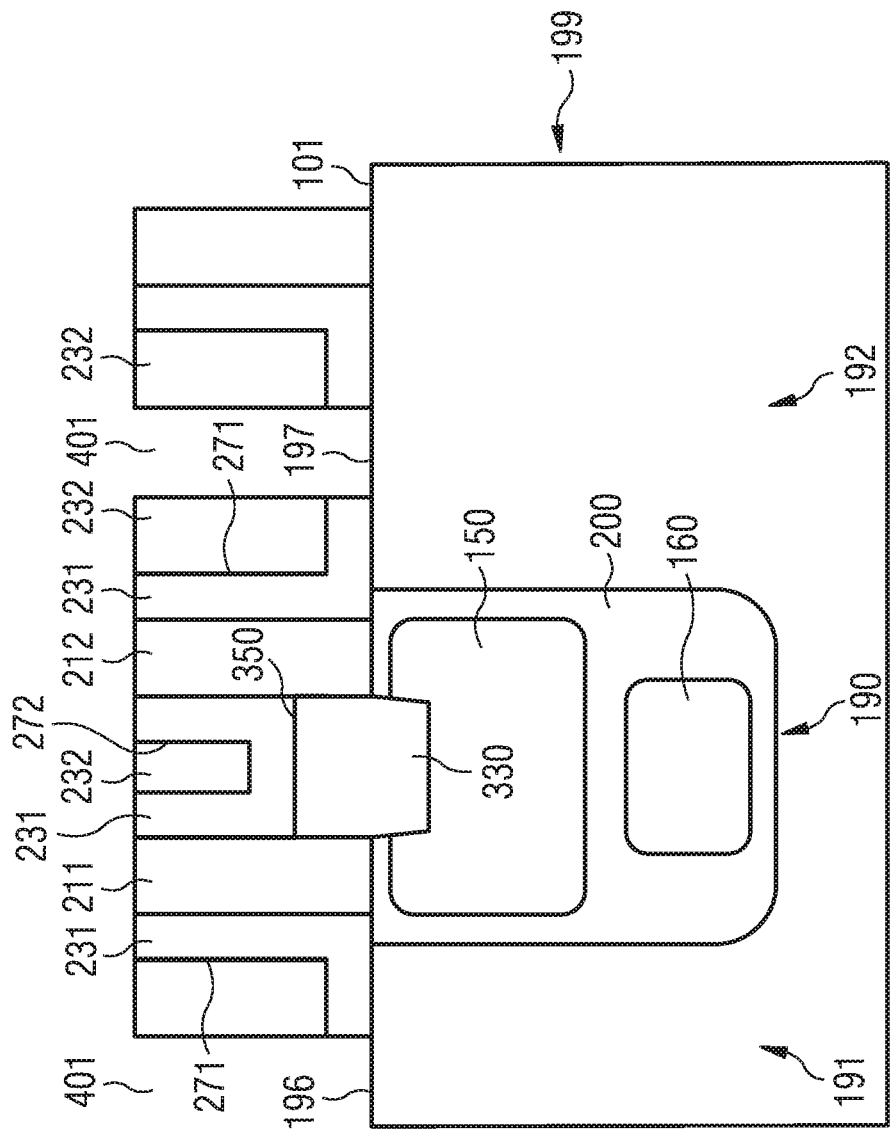

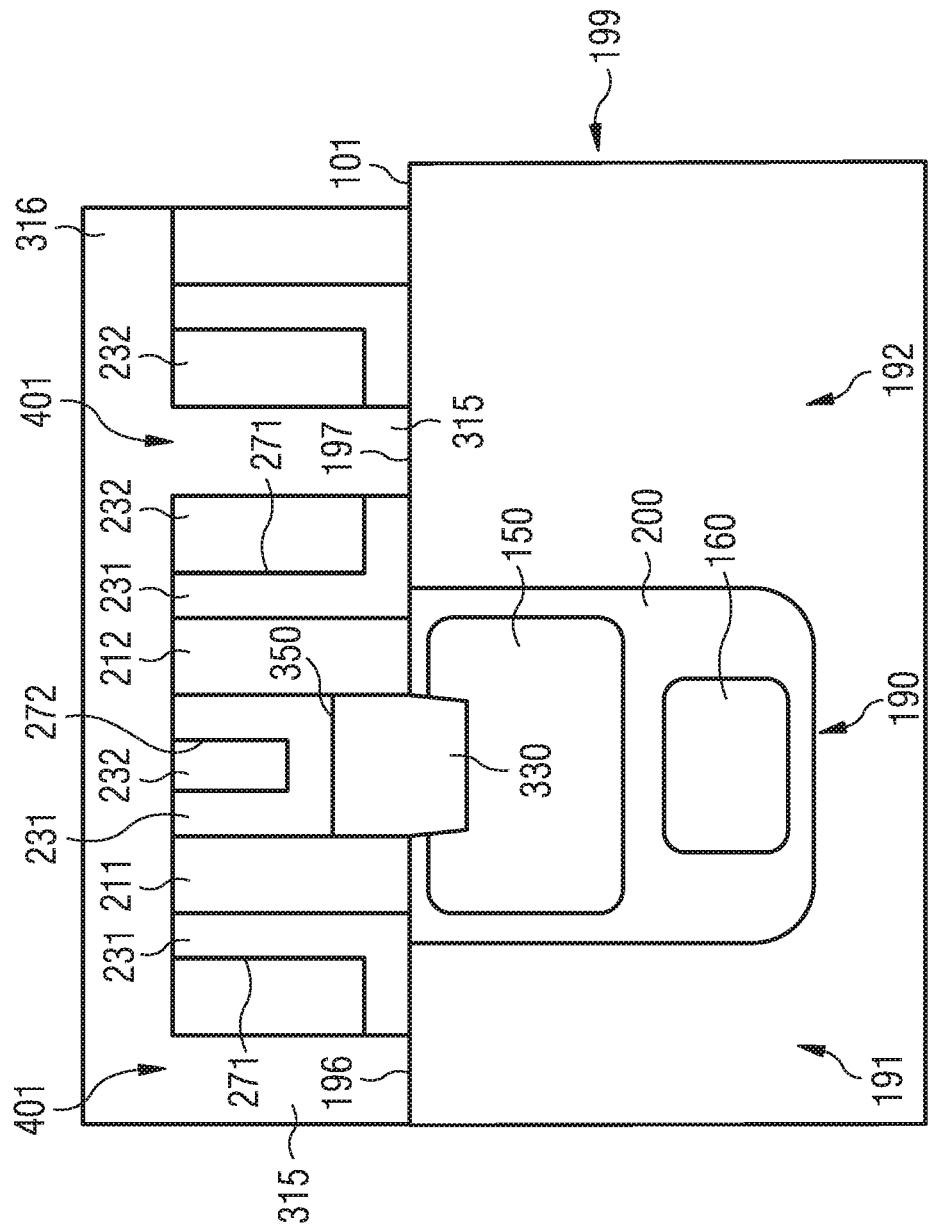

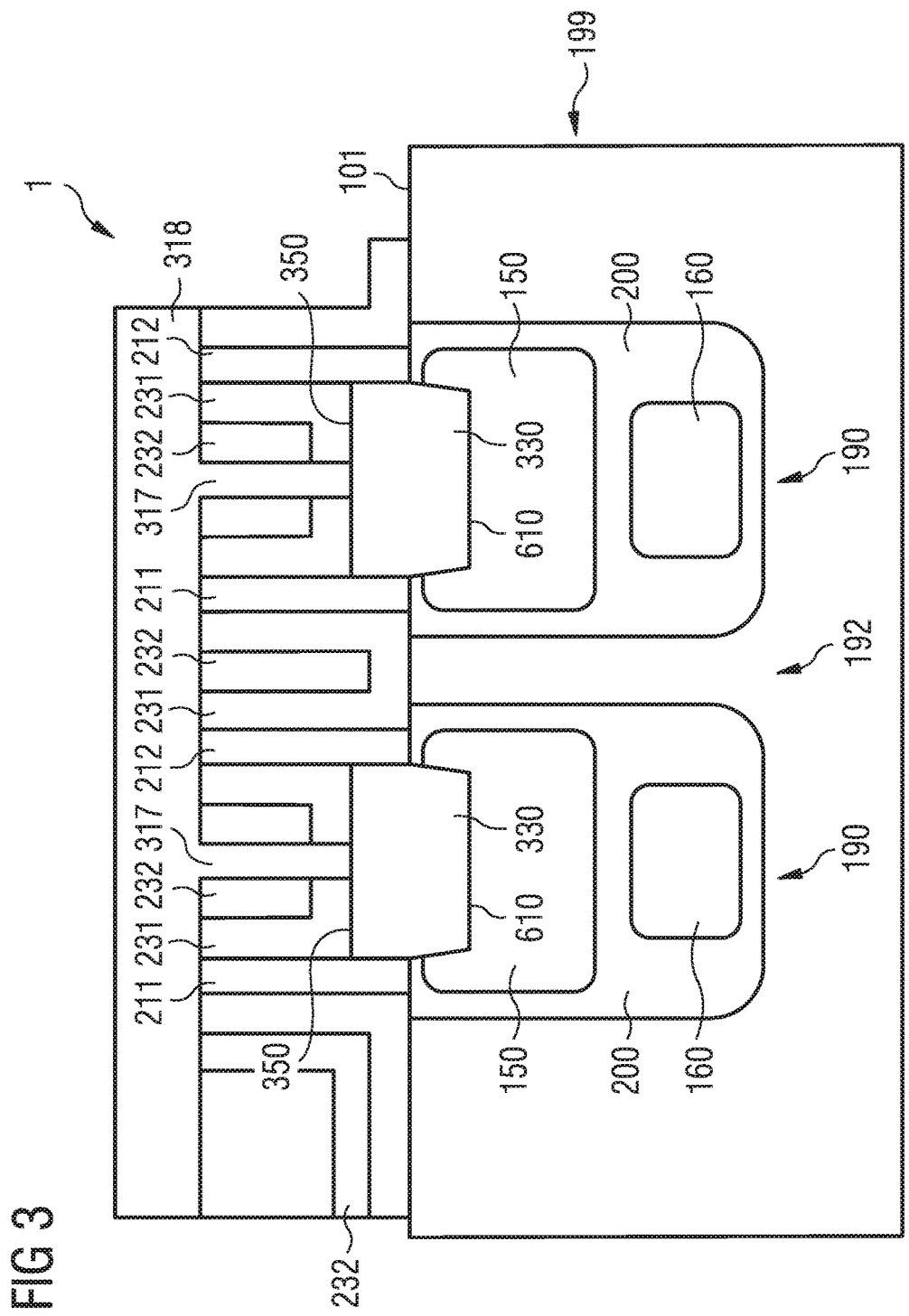

SEMICONDUCTOR DEVICE HAVING A TRENCH GATE ELECTRODE

PRIORITY CLAIM

This application is a Divisional of U.S. application Ser. No. 14/935,171 filed on 6 Nov. 2015, which in turn claims priority to German Patent Application No. 10 2014 116 706.6 filed on 14 Nov. 2014, the content of both of said applications incorporated herein by reference in their entirety.

TECHNICAL FIELD

Embodiments described herein relate to semiconductor devices which include a gate electrode, such as a gate electrode within a trench. Further embodiments pertain to methods for manufacturing such semiconductor devices.

BACKGROUND

It is desirable to design semiconductor devices capable of reliably performing under demanding conditions. Semiconductor device performance specifications can be affected by feature sizes. For example, the reduction of the size of transistors can result in compromises in device performance. For example, narrowing of conductive features such as gate electrodes can lead to an increase in gate resistance, ohmic losses, and/or undesirable heating of a semiconductor device especially when the device is operated at high current densities. There is therefore a desire to maintain or even improve device performance specifications, while allowing for miniaturization.

SUMMARY

According to an embodiment, a method for manufacturing a semiconductor device includes: providing a semiconductor substrate comprising a main surface and a gate electrode which is within a trench between neighboring semiconductor mesas, wherein the gate electrode is electrically insulated from the neighboring semiconductor mesas by respective dielectric layers; forming a respective pillar on each of the neighboring semiconductor mesas leaving an opening between the pillars above the trench; forming dielectric contact spacers in the opening along respective pillar side walls to narrow the opening above the gate electrode; and after forming the dielectric contact spacers, forming a conductor having an interface with the gate electrode, the interface extending along an extension of the gate electrode, wherein the conductor has a conductivity greater than the conductivity of the gate electrode.

According to an embodiment, a semiconductor device includes: a semiconductor substrate comprising a main surface; a gate electrode which, as viewed in a cross-section perpendicular to the main surface, is within a trench between neighboring semiconductor mesas, wherein the gate electrode is electrically insulated from the neighboring semiconductor mesas by respective dielectric layers; a conductor; and an interface of the conductor and the gate electrode, the interface extending along the gate electrode, wherein the conductor is arranged, at least partially, between neighboring dielectric contact spacers, and the conductor has a conductivity greater than a conductivity of the gate electrode.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIGS. 2A to 2I illustrate a method for manufacturing a semiconductor device according to an embodiment described herein.

FIG. 3 illustrates a semiconductor device, according to embodiments described herein.

DETAILED DESCRIPTION

Figure 1:
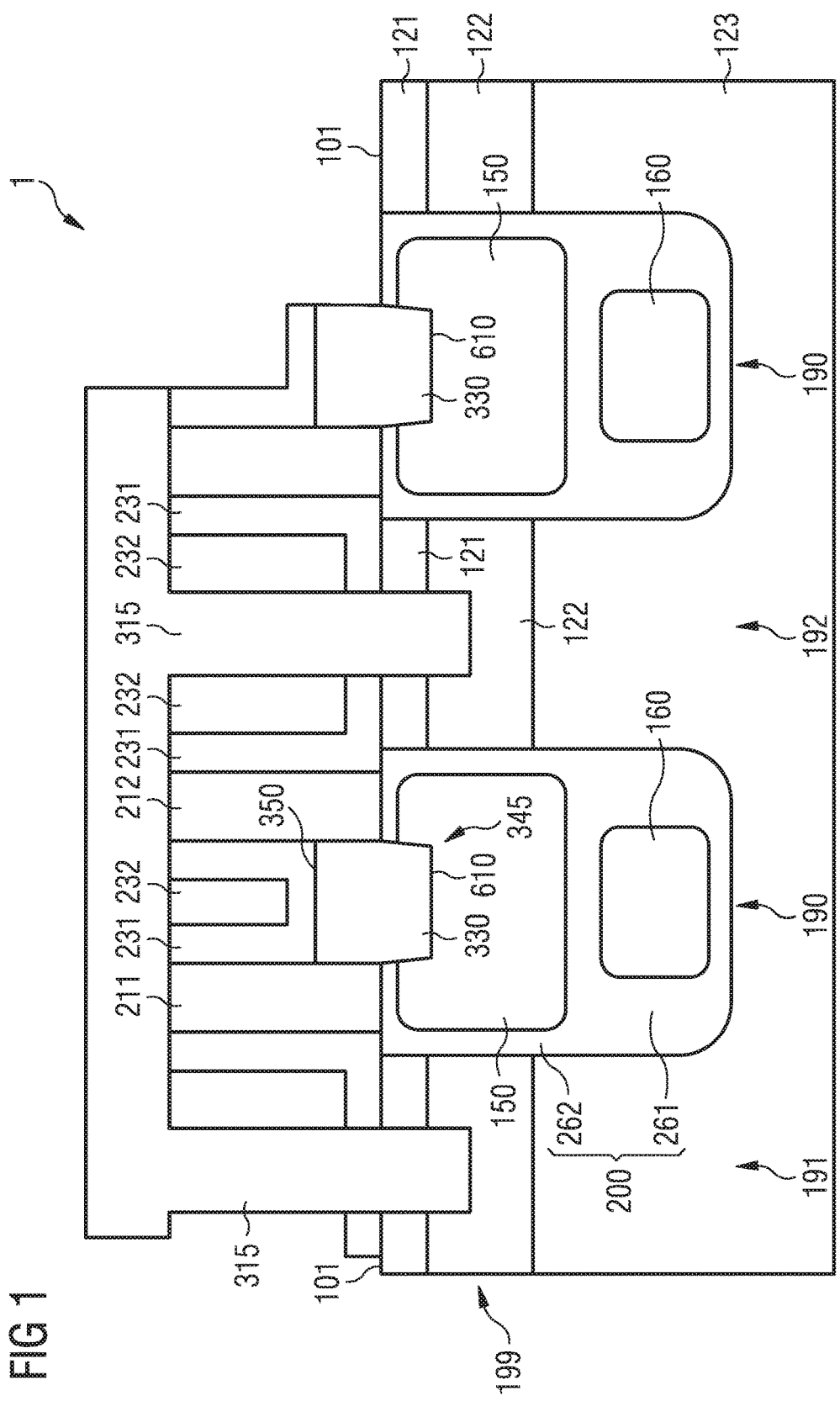
FIG. 1 illustrates a semiconductor device, according to an embodiment described herein.

In the following detailed description, reference is made to the accompanying drawings, which form a part hereof, and in which are shown by way of illustration specific embodiments in which the invention may be practiced. In this regard, directional terminology, such as "top," "bottom," "front," "back," leading," "trailing," "lateral", "vertical" etc., is used with reference to the orientation of the figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second side or surface of a semiconductor substrate is considered to be formed by the lower or back-side side or surface while a first side or surface is considered to be formed by the top or main side or surface of the semiconductor substrate. The terms "above" and "below" as used in this specification, likewise "top" and "bottom," therefore describe a relative location of a structural feature to another structural feature with consideration of this orientation. Furthermore, spatially relative terms such as "under," "below," "lower," "over," "upper" and the like, are used for ease of description to explain the positioning of one feature relative to a second feature. These terms are intended to encompass different orientations of the device in addition to different orientations than those depicted in the figures. Further, terms such as "first," "second," and the like, are also used to describe various features, regions, sections, etc. and are also not intended to be limiting. Like terms may refer to like features throughout the description.

Herein, particularly when referring to the trench, gate electrode, and/or conductor, for example, the "length," "extension," and "extent" can be used interchangeably, and can refer to a long axis of the feature. "Width" can refer to the direction of the structure which is perpendicular to the extension. "Width" and "length" can also refer to dimensions in the width and length directions, respectively.

The terms "electrical connection" and "electrically connected" can describe an ohmic connection between two features.

Herein, a "normal projection" onto a plane or surface means a perpendicular projection onto the plane or surface. In other words, the view direction is perpendicular to the surface or plane.

Herein, "dielectric layer" can refer to a plurality of dielectric layers that are optionally connected. For example, a dielectric layer separates the gate electrode 150 from the semiconductor mesa(s) 191, 192, and optionally separates the field electrode 160 from each of the gate electrode 150 and semiconductor mesa(s) 191, 192.

Herein, an "interface" as described herein may be detected for example by electron microscopy methods such as SEM, and/or energy dispersive x-ray spectroscopy.

The semiconductor substrate can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise. With the above range of variations and applications in mind, it should be understood that the present invention is not limited by the foregoing description, nor is it limited by the accompanying drawings. Instead, the present invention is limited only by the following claims and their legal equivalents.

Herein, "heavily doped polysilicon" can refer to a dopant concentration of approximately more than $10^{17}$, $10^{18}$, or $10^{19}$ atoms/cm$^3$, such as approximately $10^{20}$ atoms/cm$^3$. Herein, polysilicon can include heavily doped polysilicon.

FIG. 1 illustrates a semiconductor device 1 according to embodiments described herein. The semiconductor device 1 has a main surface 101 of a semiconductor substrate 199. The main surface 101 may be regarded as a virtually continuous surface which may be flat and uncurved. The main surface 101 can be particularly useful for purposes of describing the relative positions of features of the semiconductor device 1. The main surface 101 can be regarded as a plane extending continuously such that it is coplanar with a top or main side of the semiconductor substrate 199.

The semiconductor device 1, as illustrated in FIG. 1, has a gate electrode 150 which, as viewed in a cross-section which is perpendicular to the main surface 101, is within a trench 190 between neighboring semiconductor mesas 191, 192. The semiconductor mesas 191, 192 can extend up to the main surface 101. The gate electrode 150 is electrically insulated from the neighboring semiconductor mesas 191, 192 by respective dielectric layers 200, which can be, for example, within the trench 190, and/or along walls of the trench 190, particularly bottom and side walls. The dielectric layers 200 may extend up to the main surface 101, such as to insulate the gate electrode 150 from the neighboring semiconductor mesas 191, 192. For example, the semiconductor device 1 can include a polysilicon/GOX interface at the boundary of the gate electrode 150 and dielectric layer 200.

A field electrode 160 can be arranged in each of the trenches 190 below the gate electrode 150.

The dielectric layers 200 include, for example, gate dielectrics 262 of respective transistor cells and field dielectrics or field oxides 261 which are thicker than the respective gate dielectrics 262. The gate dielectrics 262 are arranged between the gate electrode 150 and the adjacent semiconductor material of the semiconductor mesas 191, 192 and can have a thickness between 3 nm and 30 nm.

The field dielectrics or field oxides 261 are arranged between field electrodes 160 and the adjacent semiconductor material of the semiconductor mesas 191, 192 and can have a thickness between 20 nm and 300 nm to withstand the rated blocking voltage of the semiconductor device. The rated blocking voltage is larger than the voltage applied to the gate electrode 150.

The semiconductor device 1, as illustrated in FIG. 1, also includes a conductor 330 which forms or has an interface 610 with the gate electrode 150. It is beneficial that the conductor 330 has a specific conductivity greater than the conductivity of the gate electrode 150, such as a conductivity of more than 3 times, or preferably more than 5 times greater than that of the gate electrode 150. For example, the sheet resistance of the material of the gate electrode 150, which can be polysilicon, including heavily doped polysilicon, is more than 3 times greater, and preferably more than 5 times greater, than a sheet resistance of the material of the conductor 330. For example, when the device includes a relatively highly conductive conductor (particularly relative to the gate electrode) there can be less ohmic loss and heat generation such as when operating at high current. The conductor 330 can beneficially reduce the gate resistance of the semiconductor device 1. Switching speed of the semiconductor device 1 may also be increased.

The conductor 330 can include a metal, metal alloy, metal nitrides, metal silicides, and combinations thereof. The conductor can include tungsten, titanium, cobalt, and/or copper, for example; the conductor 330 can include a metal silicide such as titanium silicide, cobalt silicide, and/or copper silicide; the conductor 330 can include a nitride such as titanium nitride. A conductor 330 which includes or consists of titanium and titanium nitride is beneficial, as is titanium nitride and tungsten. The conductor 330 can optionally be a metal having a sheet resistance of less than 5 times the sheet resistance of the gate electrode 150, which may be polysilicon. An increased conductivity of the conductor 330 can lead to overall reduced gate resistance and/or increase the switching speed of the semiconductor device 1.

The width of the trench 190 can be between 100 nm and 200 nm. Partially or completely embedding the conductor 330 into the gate electrode 150 is particularly beneficial for gate electrodes 150 having a small cross-sectional area.

The conductor 330 is, as viewed in a cross-section perpendicular to the main surface 101, within the trench 190 between the neighboring semiconductor mesas 191, 192, i.e., the conductor 330 is spaced from the side walls of the adjacent mesas 191, 192, typically at the same distance.

The interface 610 between the gate electrode 150 and the conductor 330 can extend along the gate electrode 150, particularly in a direction perpendicular to the cross-sectional view of FIG. 1, such as along a length of the gate electrode 150 in a direction parallel to the main surface 101. The interface 610 can extend within the trench 190, such as below the main surface 101.

The interface 610 can be a 2-dimensional or 3-dimensional direct interface between the conductor 330 and the gate electrode 150 to form a good ohmic contact between the conductor 330 and the gate electrode 150.

The conductor 330 can be arranged, at least partially, between neighboring dielectric contact spacers 211, 212. The dielectric contact spacers 211, 212 may insulate the conductor 330 from neighboring features such as an electrical contact 315 which may lead to the neighboring semiconductor mesas 191, 192. An electrical contact 315 which can lead to the semiconductor mesas 191, 192 may make electrical contact with at least one of the neighboring semiconductor mesas 191, 192, and may be referred to as a source contact. An electrical short circuit between the electrical contact 315 and either of the gate electrode 150 and the conductor 330 can be avoided by intervening dielectric materials. For example, the dielectric layers 200, dielectric spacers 211, 212, and/or further dielectric layers such as first and second dielectric layers 231, 232 may be disposed between the electrical contact 315 and at least one of the gate electrode 150 and the conductor 330.

In an embodiment, the conductor 330 of the semiconductor device 1 can extend above the main surface 101. The conductor 330 can extend from below the main surface 101 to above the main surface 101. For example, a bottom face of the conductor 330 and a portion of side faces of the conductor 330 can form an interface 610 with the gate electrode 150 and are thus in an electrical connection with the gate electrode 150.

In an embodiment, the semiconductor device 1 can include a recess 345 in the gate electrode 150. A region of the conductor 330 can be arranged in the recess 345. The recess 345 can form at least a part of the interface 610. The recess 345 can result in a robust electrical contact between the conductor 330 and the gate electrode 150. The recess 345 can result in a conductor 330 having an increased cross section and an increased interfacial area of the interface 610, which can reduce the gate resistance and/or increase switching speed of the semiconductor device 1.

In an embodiment, a top surface 350 of the conductor 330 can be between the dielectric contact spacers 211, 212, such as between the neighboring dielectric contact spacers 211, 212. The top or main surface 350 of the conductor 330 can be opposite the interface 610 of the conductor 330 and the gate electrode 150.

In an embodiment, in a normal projection onto the main surface 101, the conductor 330 can be within the gate electrode 150, i.e., the lateral width along a line parallel to the main surface 101 is within the gate electrode 150. This can help provide adequate insulation between the conductor 330 and the electrical contact 315, and can beneficially increase breakdown voltage, for example.

In an embodiment, the sheet resistance of a material of the gate electrode 150 can be more than 3 times and preferably more than 5 times greater than the sheet resistance of a material of the conductor 330. The material of the gate electrode 150 can be, for example, polysilicon and/or heavily doped polysilicon. A highly conductive conductor 330 is desirable and can result in reduced gate resistance.

In an embodiment, the width of the trench 190 can be more than, for example more than twice, the width of either of the semiconductor mesa 191 and the neighboring semiconductor mesa 192. An increased width of the trench can beneficially increase the areal cross-section available for the conductor 330, thus decreasing the gate resistance.

In an embodiment, the conductor 330 can include at least one of a metal, a metal alloy, a metal nitride, and a metal silicide. The use of such material for the conductor 330 can reduce the gate resistance, for example.

Along at least some of the length of the gate electrode 150, the top surface 350 of the conductor 330 can be insulated from the main surface 101 of the device, for example by at least one dielectric layer 231, 232 (first and second dielectric layers). The gate electrode 150 and conductor 330 can be thereby insulated from an electrical contact, such as a source contact, which may be disposed on the top of the device, including, for example, the top of the dielectric layer(s) 231, 232 (first and second dielectric layers). The aforementioned electrical contact, disposed on the top of the device, may be a source contact intended to electrically connect to the semiconductor mesa(s), and intended to be insulated from the gate electrode.

The semiconductor device can be a power semiconductor device having a plurality of transistor cells formed in the semiconductor substrate 199. The gate electrode 150 forms the gate electrodes of the respective transistor cells. The conductor 330 reduces the effective resistance of the gate electrodes 150 to improve distribution of the gate signal to each of the transistor cells. The semiconductor device can be, for example, a MOSFET or an IGBT.

An embodiment is described with reference to FIGS. 2A to 2I, which illustrate a method for manufacturing a semiconductor device 1 according to embodiments described herein.

FIG. 2A shows semiconductor substrate 199 which has a main surface 101 and a gate electrode 150, according to embodiments described herein. The gate electrode 150, as viewed in a cross-section perpendicular to the main surface 101, can be within a trench 190 between neighboring semiconductor mesas 191, 192. The gate electrode 150 can be electrically insulated from the neighboring semiconductor mesas 191, 192 by respective gate dielectrics 262.

The semiconductor substrate 199 can include a weakly n-doped drift region 123, a p-doped body region 122, and highly n-doped source regions 121. Upon application of a gate voltage to the gate electrode 150, for example a positive voltage relative to the body region 122, a conductive channel is formed in the body region 122 along the gate dielectric 262 to provide an ohmic connection between the source region 121 and the drift region 123.

The semiconductor substrate 199 can further include an n-doped drain region 124 at its lower side to form a power MOSFET. Alternatively, semiconductor substrate 199 can include a p-doped emitter region 124 at its lower side to form an IGBT.

The gate electrode 150 can be highly n-doped polysilicon material, which can be in-situ doped during deposition or by means of a separate doping process. For example, the gate electrode 150 can be doped together with the source region 121.

There can also be a field electrode 160, such as below the gate electrode 150. The field electrode 160 and gate electrode 150 may be separated and insulated from each other by an inner-trench insulation 263 as illustrated in FIG. 2A.

On each of the neighboring semiconductor mesas 191, 192, a respective pillar 201, 202 can be formed. The pillars 201, 202 can be formed after the gate electrode 150 is provided. For example, the pillars 201, 202 can be formed by thermal oxidation of exposed upper portions of the semiconductor mesas 191, 192 so that the pillars 201, 202 are selectively formed at the exposed portions. The pillars 201, 202 are thus formed self-aligned relative to the trenches 190. Inner side walls 251, 252 of the pillars 201, 202 can be, for example, at a given lateral distance to lateral side walls of the trench 190. Moreover, the side walls 251, 252 have the same lateral distance to the respective side walls of the trench 190 so that the arrangement of the pillars 201, 202 is symmetric relative to the trench 190. Any structural feature which is formed in a self-aligned manner relative to the pillars 201, 202 will thus also be symmetric relative to the trench 190. For example, as described below, the conductor 330 will be equally spaced from the side walls of the trench 190 as the conductor 330 is formed using the pillars 201, 202 and dielectric contact spacers 211, 212, which are formed self-aligned to the pillars 201, 202 and thus to the trench 190, as mask.

Typically, the source regions 121 and the body region 122 are formed prior to the formation of the pillars 201, 202. The thermal process used to form the semiconductor mesas 191, 192 can also be used to diffuse implanted dopants for the source and body regions further into the semiconductor substrate 199.

For ease of illustration, source regions 121, body region 122, drift region 123, and drain region 124 are only illustrated in FIG. 2A but will also be present in FIGS. 2B to 2I.

An opening 400 typically remains between the pillars 201, 202, above the trench 190. Due to the self-aligned formation of the pillars 201, 202, the opening 400 is self-aligned relative to the trench 190.

Dielectric contact spacers 211, 212 can be formed in the opening 400 along the respective pillar side walls 251, 252 to narrow the opening 400 above the gate electrode 150. The dielectric spacers 211, 212 equally narrow the opening 400, so that the narrowed opening 400 is equally spaced from side walls of the mesas 191, 192 when viewed in a cross-section perpendicular to the main surface. The narrowed opening 400, after the formation of the dielectric contact spacers 211, 212, can therefore be, viewed in a normal projection onto the main surface 101, within the gate electrode 150.

The dielectric contact spacers 211, 212 can be formed, for example, by conformal deposition of a layer of an insulating material followed by anisotropic etching back. The thickness of the layer of the insulating material should be smaller than half of the width of the opening 400 (width before deposition of the dielectric contact spacers 211, 212), or the lateral distance between neighboring mesas 191, 192 to avoid that the opening is completely filled with the insulating material of the layer. The insulating material is typically different to the material of the pillars 201, 202 to allow a selective etching of the insulating material of the layer, and thus of the dielectric contact spacers 211, 212, relative to the pillars 201, 202.

According to an embodiment, the material of the pillars 201, 202 is an oxide such as silicon oxide, and the material of the dielectric contact spacers 211, 212 is a nitride such as silicon nitride.

The dielectric contact spacers 211, 212 narrow the opening 400 to an extent so that the remaining opening is, as viewed in a cross-sectional view, smaller than the lateral width (along a line parallel to the main surface 101) of the gate electrode 150. For example, the dielectric contact spacers 211, 212 are thicker than the gate dielectric 262.

According to an embodiment, the dielectric contact spacers 211, 212 narrow the opening 400 by about at least 15% relative to the initial width of the opening 400. For example, the opening 400 can have an initial width between 150 nm and 250 nm and each of the dielectric contact spacers 211, 212 can have lateral width between 20 nm and 50 nm.

FIG. 2B illustrates, according to embodiment described herein, the optional formation of a recess 345, which may be etched into a top surface 155 of the gate electrode 150, using the dielectric contact spacers 211, 212 as an etch mask. The recess 345 is etched before forming a conductor 330, particularly a conductor 330 having an interface 610 with the gate electrode 150. The recess 345 may increase the area of the interface 610 between the conductor 330 and gate electrode 150. This may allow for an increased areal cross-section of the conductor 330 and reduce the gate resistance, particularly in embodiments which include a long buried gate electrode.

The recess 345 is etched using an anisotropic etching process with, for example, time-controlled etching to prevent that the recess 345 extends as far as to the bottom of the gate electrode 150. For example, the recess 345 can extend to a vertical depth of the gate electrode 150, measured from a top surface 155 of the gate electrode 150, of about 10% to 30% of the total vertical thickness of the gate electrode 150.

As illustrated in FIG. 2C, a conductor 330 is formed at least partially in the recess 345, according to embodiments described herein. If no recess is formed in the gate electrode 150, the conductor is formed on the top surface 155 of the gate electrode 150 after an optional removal of an optional oxide layer formed on the top surface 155 of the gate electrode 150.

The conductor 330 is formed after the formation of the dielectric contact spacers 211, 212. At least one of the dielectric contact spacers 211, 212 can aid in providing insulating material which insulates the gate electrode 150 and/or the conductor 330 from a metal contact 315 which may be formed subsequently. The dielectric contact spacers 211, 212 can also aid the formation of the conductor, such that the conductor 330 is formed narrower than the gate electrode 150.

The conductor 330 can make contact with the gate electrode 150, which can lie between the conductor 330 and the dielectric layer 200 and/or semiconductor mesa(s) 191, 192.

Direct contact between the conductor 330 and the dielectric layer 200 and/or semiconductor mesa(s) 191, 192 can be avoided, which can be undesirable, particularly if the material of the conductor 330 could migrate into the semiconductor material such as the semiconductor mesa(s) 191, 192, affecting dopant concentrations and impacting breakdown voltages and other device parameters. The illustrated geometry, particularly with the interface 610 of the conductor 330 being with the gate electrode 150, particularly a top surface 155 thereof, can thus avoid problems associated with electromigration. Additionally, the conductor can decrease heating of the device which might otherwise be significant, particularly in devices operating at high current densities.

More specifically, as the dielectric contact spacers 211, 212 are formed on side walls of the self-aligned pillars 201, 202, the conductor 330 is also formed self-aligned relative to the pillars 201, 202 and thus to the side walls of the mesas 191, 192 and therefore equally spaced from the gate dielectrics 262 to avoid direct contact between a metal and the gate dielectrics 262.

The conductor 330 has a lateral width along a line parallel to the main surface 101 which is smaller than the lateral width of the gate electrode 150 along this line.

The conductor 330 can be formed to have an interface 610 with the gate electrode 150, the interface 610 extending along an extension of the gate electrode 150, such as in a direction parallel to the main surface 101. Thus, the conductor 330 can form a comparatively low resistance path, particularly in comparison to devices in which current travels along the extent of the gate electrode 150 only, such as along the trench length. The length of the gate electrode 150 may impact gate resistance which may, in turn, significantly impact device performance limits. The conductor 330, as described herein, can reduce gate resistance and improve device performance.

The conductor 330 can have a specific or total conductivity which is greater than the conductivity of the gate electrode 150. This can beneficially decrease gate resistance.

Optionally, the conductor 330 is formed such that a top surface 350 of the conductor 330 is in the opening 400 between the dielectric contact spacers 211, 212. If the top surface 350 of the conductor 330 is in the opening 400, the cross-sectional area of the conductor 330 can be beneficially increased, reducing the gate resistance and/or increasing the switching speed capability of the semiconductor device 1.

It is noted that a reduced gate resistivity can allow for narrower gate electrodes to be formed which may allow for an increase in the areal density of transistors of the device. Furthermore, by exploiting self-alignment processes in the deposition of the conductor 330, the semiconductor mesas 191, 192 can be narrowed. This can beneficially increase the density of transistors of the semiconductor device 1. Furthermore, narrowing the mesas 191, 192 allows to increase the doping concentration of the drift region 123 between semiconductor mesas 191, 192 which reduces the on-resistance of the semiconductor device. The conductor 330 can be formed such that the conductor 330 extends from below the main surface 101 to above the main surface 101.

Formation of the conductor 330 can include depositing a material forming the conductor 330, optionally followed by etching a portion of the material forming the conductor. This may lead to optimal control of the cross-sectional area of the conductor 330, such as maximizing the area of the conductor 330 to reduce gate resistance and/or increase device switching speed.

The conductor 330 can include at least one of a metal, metal alloy, metal nitrides, metals silicides, and a combination thereof. The conductor may, in some embodiments, exclude polysilicon (including highly doped silicon), and use more conductive materials, for example, in order to minimize gate resistance.

FIG. 2D illustrates the deposition of a filler material 340, according to embodiments described herein. The filler material 340 can be an insulator such as a nitride which may remain until the formation of the semiconductor device 1 is complete. Alternatively, the filler material 340 can be removable, particularly if electrical contact to the conductor 330 from above is desired, as in some embodiments. For example, a removable filler material 340 can be a carbon based material that may be ashed, for example carbon and/or a polymer such as a resist. The filler material 340 may protect, at least partially, the underlying conductor 330 from being removed during subsequent processing steps, such as removal of the pillars 201, 202. The filler material 340 can mask the top surface 350 of the conductor 330.

FIG. 2E illustrates the removal of the pillars 201, 202, in accordance with embodiments described herein. The pillars 201, 202 can be removed, for example by etching, after forming the conductor 330. Removal of the pillars 201, 202 can expose a top surface 196, 197 of the respective neighboring semiconductor mesas 191, 192. Removal of the pillars 201, 202 can also expose outer side walls 221, 222 of the dielectric contact spacers 211, 212. The exposed outer side walls 221, 222 of the dielectric contact spacers 211, 212, which are arranged above a given trench 1990, face away from each other.

The filler material 340 can also be removed which results in exposed inner side walls 223, 224 of the dielectric contact spacers 211, 212 above a given trench 190, which inner side walls 223, 224 face to each other and thus to the opening 400.

FIG. 2F through 2H illustrate a widening of the dielectric contact spacers 211, 212, and a masking of a region between the dielectric contact spacers 211, 212, according to embodiments described herein. Widening of the dielectric contact spacers 211 to reduce an exposed surface area of the top surfaces 196, 197 of the semiconductor mesas 191, 192 can be done before forming an electrical contact 315. A region between the dielectric contact spacers 211, 212, above the conductor 150, can be masked, such as simultaneously with the widening of the dielectric contact spacers 211, 212.

Masking of the region between the dielectric contact spacers 211, 212 can aid in insulating the conductor 330 from an electrical contact 315, such as a source contact, which may extend along much of the main surface of the semiconductor device 1.

Widening the dielectric contact spacers 211 can be beneficial for forming electrical insulation, for example that a subsequently formed electrical contact to the semiconductor mesas, such as a source metal, is insulated from the conductor 330 and/or gate electrode 150.

Widening the dielectric contact spacers 211 can include, as illustrated in FIG. 2F, depositing a further dielectric material to form a first insulating layer 230 on the top surfaces 196, 197 of the semiconductor mesas 191, 192, according to embodiments described herein. The further dielectric material forming the first insulating layer 230 can also be deposited in a region between the dielectric contact spacers 211, 212, above the conductor 150. The first insulating layer 230 can optionally completely fill the opening 400 between the dielectric contact spacers 211, 212, above the conductor 150.

FIG. 2F illustrates an alternative where the first insulating layer 230 forms a conformal layer which further narrows the opening 400 between the inner side walls 223, 224 of the dielectric contact spacers 211, 212, and also narrows the space between the outer side walls 221, 222 of the dielectric contact spacers 211, 212 above the semiconductor mesas 191, 192. The first insulating layer 230 does not completely fill the space between the inner side walls 223, 224 of the dielectric contact spacers 211, 212.

To completely fill the space between the inner side walls 223, 224 of the dielectric contact spacers 211, 212, a further dielectric material can be optionally deposited to form a second insulating layer 235 to fill the region between the inner side walls of the dielectric contact spacers 211, 212, above the conductor 150, as illustrated in FIG. 2G.

The first insulating layer 230 can be deposited along the outer side walls 221, 222 of the dielectric contact spacers and the inner side walls 223, 224 which face each other over the region above the conductor 150.

In an optional further process, as illustrated in FIG. 2G, the second insulating layer 235 is deposited onto the first insulating layer 230, typically by a conformal deposition process. The deposited second insulating layer 235 completely fills the remaining space between the inner side walls 223, 224 of the dielectric contact spacers 211, 212 over the region above the conductor 150 so that no opening 400 remains.

As the remaining distance dout between outer side walls 271 of the first insulating layer 230, which outer side walls 271 faces each other, above the semiconductor mesas 191, 192 is larger than the remaining distance din between inner side walls 272 of the first insulating layer 230 (see FIG. 2F), which inner side walls 272 faces each other, above the trench 190, the second insulating layer 235 completely fills the space between the side walls 272. On the other hand, a space 275 remains between the outer side walls 271 of the first insulating layer 230 above the mesas 191, 192 as shown in FIG. 2G.

As shown in FIG. 2H, the second insulating layer 235 can be anisotropically etched such that spacers are formed which are used as etch mask to etch the first insulating layer 230. Etching the first insulating layer 230 using the anisotropically etched second insulating layer 235 exposes portions of the top surfaces 196, 197 of the semiconductor mesas 191, 192. The dielectric material of the first insulating layer 230 and the second insulating layer 235 may remain, at least partially, along the outer side walls 221, 222 so that the exposed surface area of the top surfaces 196, 197 of the semiconductor mesas 191, 192 is laterally reduced. Furthermore, the region or space between the dielectric contact spacers 212 above the trench 190 may remain masked during etching.

The second insulating layer 235 can be etched anisotropically to form the etch mask for etching the first insulating layer 230, followed by etching the first insulating layer 230 using the etch mask formed by the second insulating layer 235. In a further process, both the first and second insulating layers 230, 235 are polished back using the dielectric contact spacers 211, 212 as stop. The resulting structure is illustrated in FIG. 2H with the etched and polished back first insulating layer 230 forming the first dielectric layer 231 and the etched and polished back second insulating layer 235 forming the second dielectric layer 232.

Alternatively, both the first and second insulating layers 230, 235 can be first polished back using the dielectric contact spacers 211, 212 as stop, followed by an anisotropic etching of the second insulating layer 235 to form the etch mask for etching the first insulating layer 230 which is subsequently etched using the etch mask formed by the second insulating layer 235. The resulting structure is also illustrated in FIG. 2H.

FIG. 2H illustrates, according to embodiments described herein, semiconductor mesas 191, 192 each having a partially exposed top surface 197. More specifically, a portion 197 of the top surface is exposed in the region of more than one semiconductor mesa 191, 192 can be partially exposed.

The second dielectric layer 232 completely fills the opening or space between the inner side walls 272 of the first insulating layer 230, which are arranged above the trench 190, and the outer side walls 271 of the first insulating layer 230, which are arranged above the mesas 191, 192. The opening above the trench 190 is therefore completely filled while an opening 401 remains above the mesas 191, 192 to expose a portion of the top surface 196, 197 of the mesas 191, 192.

The at least one top surface 196, 197 can be recessed, such as by etching into at least one semiconductor mesa 191, 192.

An electrical contact 315 can be formed, as seen in FIGS. 1 and 2I, such as by depositing a conductive material onto the exposed top surface 196 of at least one of the semiconductor mesas 191, 192. The electrical contact 315 can be self-aligned with respect to the neighboring semiconductor mesas 191, 192, and may contact at least one of the neighboring semiconductor mesas 191, 192. The electrical contact 315 can be insulated from the conductor 330. The electrical contact 315 can provide a source contact of at least one transistor formed by the semiconductor device 1.

The metal contacts 315 can be formed integral with a top metallization 316 which can form the source metallization of the semiconductor device or by using separate processes to form the contacts 315 and the top metallization 316.

FIG. 3 illustrates a semiconductor device 1 according to embodiments described herein. The semiconductor device 1 has a main surface 101 of a semiconductor substrate 199. The conductor 330 is electrically contacted by an electrical contact 317 which provides connection to a metallization 318 which is typically different than the top metallization 316. The electrical contact 317 can provide current and/or apply a voltage to the gate 150. For example, the cross-section illustrated in FIG. 3 is representative of a cross section of the device at at least one location on the device. At the location of the device illustrated in FIG. 3, the conductor 330 can be electrically contacted to the electrical contact 317.

The device may be configured so that along a majority of the length or extension of the trench, which can be perpendicular to the cross-section, the electrical contact 317 to the conductor 330 is absent. In an embodiment, in a position of the semiconductor device 1 where the electrical contact 317 to the conductor 330 is absent (for example a cross sectional area such as that illustrated in FIG. 1), the electrical contact 315 to the semiconductor mesa(s) 191, 192 may be present. The electrical contact 315 to the semiconductor mesa(s) 191, 192 can extend along the extension of the gate electric 150, such as parallel to the gate electrode 150.

The gate electrode 150 can be electrically connected to the source or insulated from the source.

The above mentioned devices and methods are particularly envisioned in devices which include self-aligned features, such as electrical contacts, and methods of manufacturing thereof, in which the semiconductor mesa widths can be made increasingly narrower. It is contemplated that at least one of the electrical contact(s) 315, 317, which can be self-aligned, can be seated within the gate electrode 150 and/or semiconductor mesa(s).

A benefit of the above described semiconductor device and methods of manufacture thereof is that the pitch can be decreased, which can lead to a greater areal density of transistors.

With the above range of variations and applications in mind, it should be understood that the present invention is not limited by the foregoing description, nor is it limited by the accompanying drawings. Instead, the present invention is limited only by the following claims and their legal equivalents.

REFERENCE LIST 1 semiconductor device
101 main surface
121 source region
122 body region
123 drift region
124 drain region/emitter region
150 gate electrode
155 top surface (gate electrode)
190 trench
191, 192 semiconductor mesas 196, 197 top surface (mesa)
199 semiconductor substrate
200 dielectric layer
201, 202 pillars
211, 212 dielectric contact spacer
221, 222 outer side wall (spacer)
223, 224 inner side wall (spacer)
230 first insulating layer
231 first dielectric layer
232 second dielectric layer
235 second insulating layer
251, 252 pillar side wall
261 field dielectric/filed oxide
262 gate dielectric
263 inner-trench insulation
271, 272 side walls
275 space
315 electrical contact
316, 318 metallization
330 conductor
332 side wall (conductor)
345 recess
350 top surface (conductor)
400 opening above trench
401 opening above mesa
610 materials interface (conductor and gate)

What is claimed is:

1. A semiconductor device, comprising:
a semiconductor substrate comprising a main surface;
a gate electrode in a trench between neighboring semiconductor mesas, the gate electrode being electrically insulated from the neighboring semiconductor mesas by a dielectric layer;
a conductor arranged, at least partially, between neighboring dielectric contact spacers, the conductor having a conductivity greater than a conductivity of the gate electrode; and
a conformal dielectric layer formed over and directly contacting top surfaces of the neighboring semiconductor mesas and the conductor,
wherein an interface between the conductor and the gate electrode extends along the gate electrode, and
wherein the top surface of the conductor is opposite from the interface between the conductor and the gate electrode.

2. The semiconductor device of claim 1, wherein the conductor extends from below the main surface to above the main surface.

3. The semiconductor device of claim 1, wherein the dielectric contact spacers are formed on the dielectric layer completely above the trench.

4. The semiconductor device of claim 1, wherein the gate electrode has a recess, wherein a region of the conductor is arranged in the recess, and wherein the recess forms at least a part of the interface between the conductor and the gate electrode.

5. The semiconductor device of claim 1, wherein a top surface of the conductor, which is opposite the interface between the conductor and the gate electrode, is arranged between the dielectric contact spacers.

6. The semiconductor device of claim 1, wherein the conductor is within the gate electrode in a normal projection onto the main surface.

7. The semiconductor device of claim 1, wherein a sheet resistance of a material of the gate electrode is more than 3 times greater than a sheet resistance of a material of the conductor, and wherein the material of the gate electrode is polysilicon.

8. The semiconductor device of claim 1, wherein a width of the trench is more than twice a width of either of the neighboring semiconductor mesas.

9. The semiconductor device of claim 1, wherein the conductivity of the conductor is more than 3 times greater than the conductivity of the gate electrode.

10. The semiconductor device of claim 1, wherein the conductivity of the conductor is more than 5 times greater than the conductivity of the gate electrode.

11. The semiconductor device of claim 1, wherein a sheet resistance of a material of the gate electrode is more than 3 times greater than a sheet resistance of a material of the conductor.

12. The semiconductor device of claim 1, wherein a sheet resistance of a material of the gate electrode is more than 5 times greater than a sheet resistance of a material of the conductor.

13. The semiconductor device of claim 1, wherein the conductor comprises at least one of a metal, a metal alloy, a metal nitride, a metal silicide, and any combination thereof.

14. The semiconductor device of claim 13, wherein the conductor comprises tungsten, titanium, cobalt, and/or copper.

15. The semiconductor device of claim 13, wherein the conductor comprises titanium silicide, cobalt silicide, and/or copper silicide.

16. The semiconductor device of claim 13, wherein the conductor comprises titanium and titanium nitride.

17. The semiconductor device of claim 13, wherein the conductor comprises titanium nitride and tungsten.

18. The semiconductor device of claim 1, wherein the conductor is spaced from side walls of the neighboring semiconductor mesas at the same distance.

19. The semiconductor device of claim 1, wherein the neighboring dielectric contact spacers insulate the conductor from an electrical contact which extends from above the main surface of the semiconductor substrate to the neighboring semiconductor mesas.

20. The semiconductor device of claim 1, further comprising a first electrical contact which extends from the conductor to a metallization disposed above the main surface of the semiconductor substrate.

21. The semiconductor device of claim 20, wherein the first electrical contact to the conductor is absent along a majority of a lengthwise extension of the trench.

22. The semiconductor device of claim 21, wherein a second electrical contact to the neighboring semiconductor mesas is present in a position of the semiconductor device where the electrical contact to the conductor is absent.

* * * * *